United States Patent
Lytle et al.

(10) Patent No.: US 7,595,226 B2
(45) Date of Patent: Sep. 29, 2009

(54) METHOD OF PACKAGING AN INTEGRATED CIRCUIT DIE

(75) Inventors: William H. Lytle, Chandler, AZ (US); Owen R. Fay, Boise, ID (US); Jianwen Xu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 240 days.

(21) Appl. No.: 11/846,671

(22) Filed: Aug. 29, 2007

(65) Prior Publication Data

US 2009/0061564 A1 Mar. 5, 2009

(51) Int. Cl.
*H01L 21/00* (2006.01)
*H01L 23/495* (2006.01)

(52) U.S. Cl. ............... 438/113; 438/460; 257/676; 257/666

(58) Field of Classification Search ............ 438/113, 438/114, 465, 460, 462; 257/676, 666, 687, 257/724

See application file for complete search history.

(56) References Cited

U.S. PATENT DOCUMENTS

| | | | |
|---|---|---|---|
| 4,918,811 A | 4/1990 | Eichelberger et al. | |
| 5,032,543 A | 7/1991 | Black et al. | |
| 5,144,747 A | 9/1992 | Eichelberger | |
| 5,250,843 A | 10/1993 | Eichelberger | |
| 5,353,498 A | 10/1994 | Fillion et al. | |
| 5,866,952 A | 2/1999 | Wojnarowski et al. | |
| 6,159,767 A | 12/2000 | Eichelberger | |
| 6,211,462 B1 | 4/2001 | Carter, Jr. et al. | |
| 6,432,182 B1 | 8/2002 | Konrad et al. | |
| 6,518,097 B1 | 2/2003 | Yim et al. | |
| 6,524,654 B1 | 2/2003 | Konrad et al. | |
| 6,661,083 B2 | 12/2003 | Lee et al. | |
| 6,673,653 B2 * | 1/2004 | Pierce ................. 438/118 | |

(Continued)

FOREIGN PATENT DOCUMENTS

WO WO 02/33751 A2 4/2002

OTHER PUBLICATIONS

Burke, Part 2—The Hildebrand Solubility Parameter, Solubility Parameters: Theory and Application, The Oakland Museum of California, Aug. 1984.

(Continued)

*Primary Examiner*—Walter L Lindsay, Jr.
(74) *Attorney, Agent, or Firm*—Meschkow & Gresham, PLC (57) ABSTRACT

A structure (40) for holding an integrated circuit die (38) during packaging includes a support substrate (42), a release film (44) attached to the substrate (42), and a swelling agent (60). A method (34) of packaging the die (38) includes placing the die (38) on the substrate (42) with its active surface (52) and bond pads (54) in contact with the film (44). The agent (60) is applied over an adhesive coating (50) of the film (44). The agent (60) causes the adhesive (50) to swell into contact with the bond pads (54) and/or to form fillets (64) of adhesive (50) about the die (38). The die (38) is encapsulated in a molding material (72) and released from the substrate (42) as a panel (74) of dies (38). Swelling of the adhesive (50) about the bond pads (54) prevents the molding material (72) from bleeding onto the bond pads (54).

20 Claims, 4 Drawing Sheets

U.S. PATENT DOCUMENTS

| | | | |
|---|---|---|---|
| 6,953,985 | B2 | 10/2005 | Lin et al. |
| 7,029,949 | B2 | 4/2006 | Farnworth et al. |
| 7,112,467 | B2 | 9/2006 | Eichelberger et al. |
| 7,413,929 | B2 * | 8/2008 | Lee et al. ............... 438/110 |
| 2004/0161908 | A1 * | 8/2004 | Terui et al. ............ 438/460 |
| 2005/0158009 | A1 | 7/2005 | Eichelberger et al. |
| 2006/0246625 | A1 * | 11/2006 | Terui et al. ............ 438/113 |
| 2007/0092996 | A1 * | 4/2007 | Lo et al. ............... 438/108 |
| 2008/0032452 | A1 * | 2/2008 | Yang et al. ............ 438/113 |
| 2009/0039530 | A1 * | 2/2009 | Fryklund et al. ....... 438/113 |

OTHER PUBLICATIONS

Keser, Redistributed Chip Packaging, Apr. 1, 2007, Tempe, Arizona, http://www.reed-electronics.com/semiconductor.

Freescale Semiconductor, Wire Bond and Beyond: Semiconductor Packaging Innovations, Jul. 2006, http://www.freescale.com.

International Search Report and Written Opinion correlating to PCT/US2008/068076, dated Jan. 23, 2009.

* cited by examiner

METHOD OF PACKAGING AN INTEGRATED CIRCUIT DIE

TECHNICAL FIELD OF THE INVENTION

The present invention relates generally to integrated circuit die packages. More specifically, the present invention relates to a method of preventing the contamination of bond pads during chips-first packaging of an integrated circuit die.

BACKGROUND OF THE INVENTION

Integrated circuit packaging is a crucial step in the process of providing small and highly performing semiconductor devices. As such, it has a significant effect on the appearance and function of end-user devices, from computers to cell phones to embedded processors. As in most electronics, the trend is to make semiconductor devices smaller, more powerful, and less costly. Integrated circuit (IC) packaging has evolved through multiple types of packaging technologies including, for example, system in package, package on package, chips first packaging, and so forth. These packaging technologies provide benefits in terms of high levels of integration, more functionality, space and weight savings, and commensurate cost savings.

System in package is a technology that allows the placement of several integrated circuits in one package, providing a complete set of device electronics in a small area. Package on package places one package on top of another for greater integration complexity and interconnect density. System in package and package on package techniques typically use wire bonding to connect the IC die and the package. Unfortunately, although wire bonding is a useful packaging technique, the wires take up valuable board space. Accordingly, flip chip techniques have been developed to eliminate wire bonding. In a flip chip process, an IC die is connected face-down to a board or substrate using ball grid array or other conductive bumps. This technique eliminates wire bonds, increases speeds and reduces size.

Chips-first packaging has been developed to counter the limitations of wire bonding and some ball grid array techniques. One chips-first packaging technique entails mounting the IC die or dies face down to a releasable adhesive and then encapsulating them to form an extended surface around the die. The resulting array structure is released from the substrate and the interconnect circuitry is built above the IC die and the extended surface. The interconnect is formed to the IC die as an integral part of the processing of the circuit board, thus eliminating the need for wire bonds, tape-automated bonds (TABs), or solder bumps.

Figure 1:
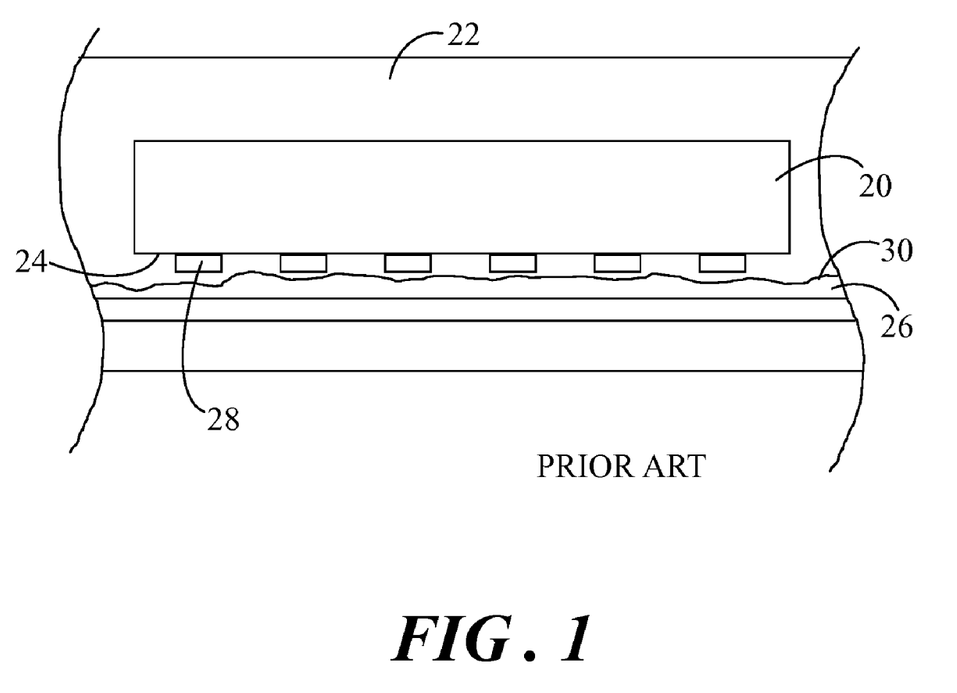
FIG. 1 shows a side view of an integrated circuit (IC) die undergoing a prior art chips-first packaging process.

FIG. 1 shows a side view of an IC die 20 undergoing a prior art chips-first packaging process. In chips-first packaging, the bare IC dies, represented by IC die 20, are typically encapsulated with a molding material 22 to form the protective package prior to building the interconnect circuitry above them. Encapsulation of IC die 20 protects it from conditions which may degrade it and allows IC die 20 to be transported, handled, and readily configured with other components. Encapsulation can also extend the surface of IC die 20, creating a platform for the redistribution of circuitry above IC die 20. This effectively makes the chip layout larger so it can be bonded to a coarser pitch circuit board. Encapsulation entails attaching the IC die 20 with its active surface 24 face down on an adhesive 26 to hold it in place. Active surface 24 of IC die 20 refers to that side of IC die 20 having bond pads 28. IC die 20 is placed in a mold, encapsulated with molding material 22 (such as a filled epoxy resin), and molding material 22 is then cured.

Unfortunately, variations in a surface 30 of adhesive 26 and mechanical placement occasionally leave gaps under IC die 20. These gaps can result in leakage, referred to herein as resin bleeding, of molding material 22 under IC die 20. This molding material 22 can then undesirably coat bond pads 28. During the cure process, molding material 22 becomes permanently attached to bond pads 28 resulting in open circuits and rendering IC die 20 useless.

A number of approaches have been tried in an attempt to solve the resin bleeding problem. For example, some prior art techniques use wells, trenches or dams around the IC die to prevent resin bleed. Others use lead frame and mold features, and high clamping force to prevent resin bleed onto the exposed bond pads of an IC package. Still others use a seal ring around the outer perimeter of the IC die or a sacrificial layer covering the bond pads that can later be removed. Unfortunately, these prior art techniques result in increased complexity and require additional design and processing steps, thus driving up cost and introducing the probability of reliability issues. Accordingly, what is needed is a method for effectively protecting bond pads of an IC die from resin bleed when undergoing chips-first packaging that can be readily implemented in existing packaging methodologies.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

Figure 2:
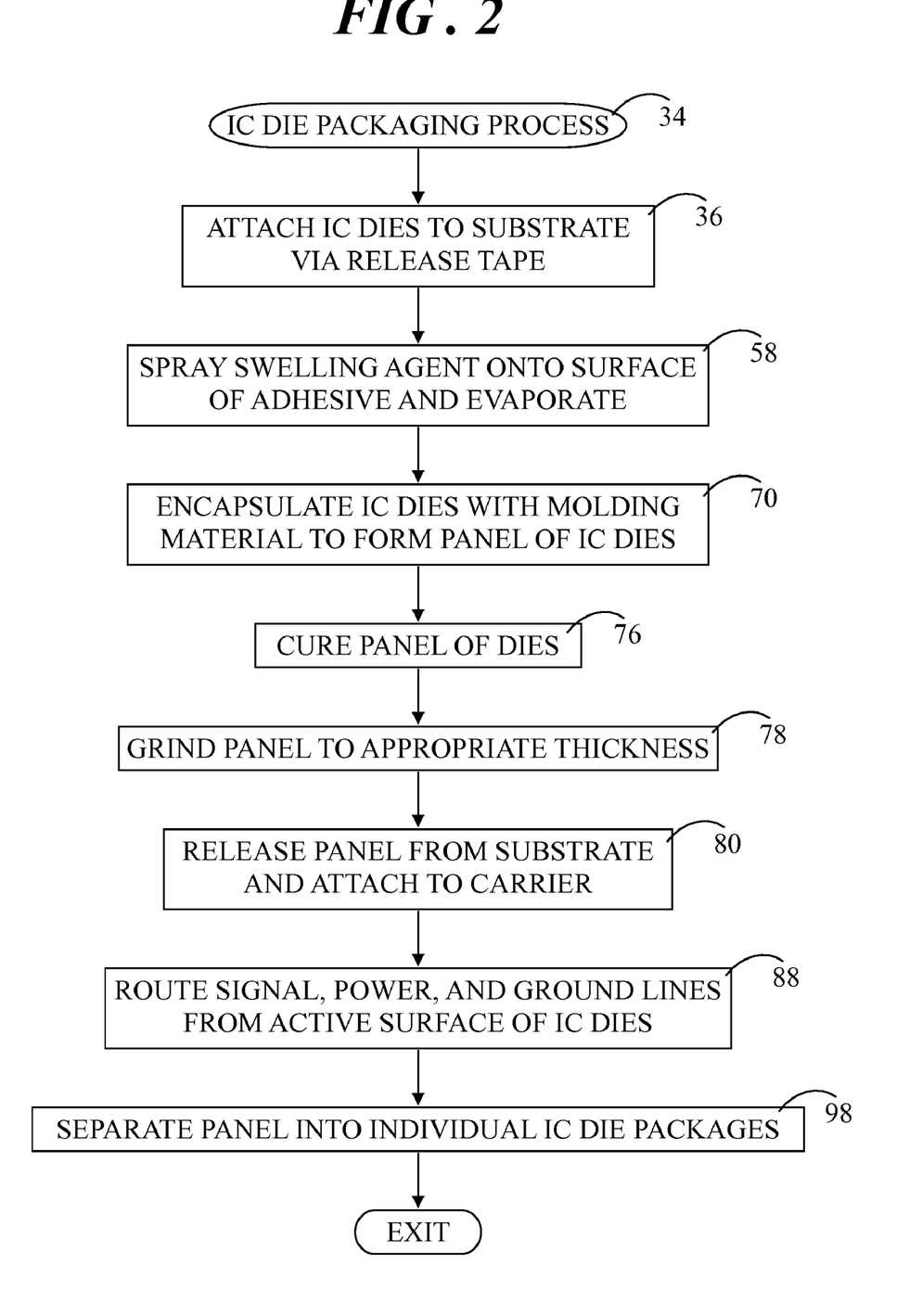
FIG. 2 shows a flowchart of an IC die packaging process in accordance with an embodiment of the invention.

FIG. 2 shows a flowchart of an integrated circuit (IC) die packaging process 34 in accordance with an embodiment of the invention. IC die packaging process 34 describes a chips-first packaging methodology that includes the application of a selected solvent to cause swelling of an adhesive coating used to hold the IC die onto a support substrate during encapsulation and cure of a molding material. The swelling of the adhesive fills gaps under the IC die and/or creates a fillet of swelled adhesive about a perimeter of the IC die which prevents a molding material from bleeding under the IC die.

Figure 3:
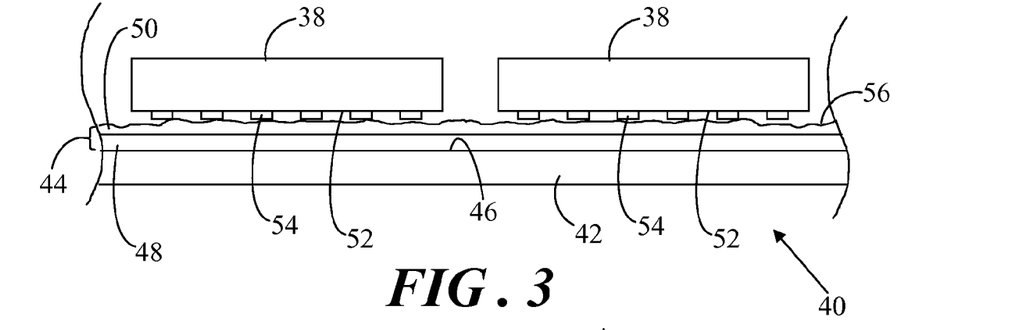
FIG. 3 shows a side view of a portion of a number of IC dies at a beginning stage of packaging in accordance with the IC die packaging process of FIG. 2.

IC die packaging process 34 begins with a task 36. At task 36, IC dies are attached to a support substrate via a release tape. Referring to FIG. 3 in connection with task 36, FIG. 3 shows a side view of a portion of a number of IC dies 38 at a beginning stage of packaging in accordance with task 36 of IC packaging process 34. A structure 40 for temporarily holding IC dies 38 during packaging thereof generally includes a support substrate 42 and a release film 44 attached to a surface 46 of support substrate 42. In one embodiment, release film 44 includes a polyimide liner 48 laminated or otherwise secured to surface 46. Liner 48 is coated with a silicone polymer adhesive coating 50. At task 36, singulated IC dies 38 are placed on support substrate 42 with an active surface 52 of each of IC dies 38 face down on adhesive coating 50. Active surface 52 of IC dies 38 refers to that side of each of IC dies 38 having bond pads 54. As shown, adhesive coating 50 has a non-uniform surface 56. Non-uniform surface 56 can cause gaps between bond pads 54 and adhesive coating 50.

The present invention is discussed in connection with the packaging of singulated, or individual IC dies 38. However, the present invention applies equally to the packaging of multi-chip modules, each of which includes multiple singulated IC dies that can perform various functions.

Figure 4:
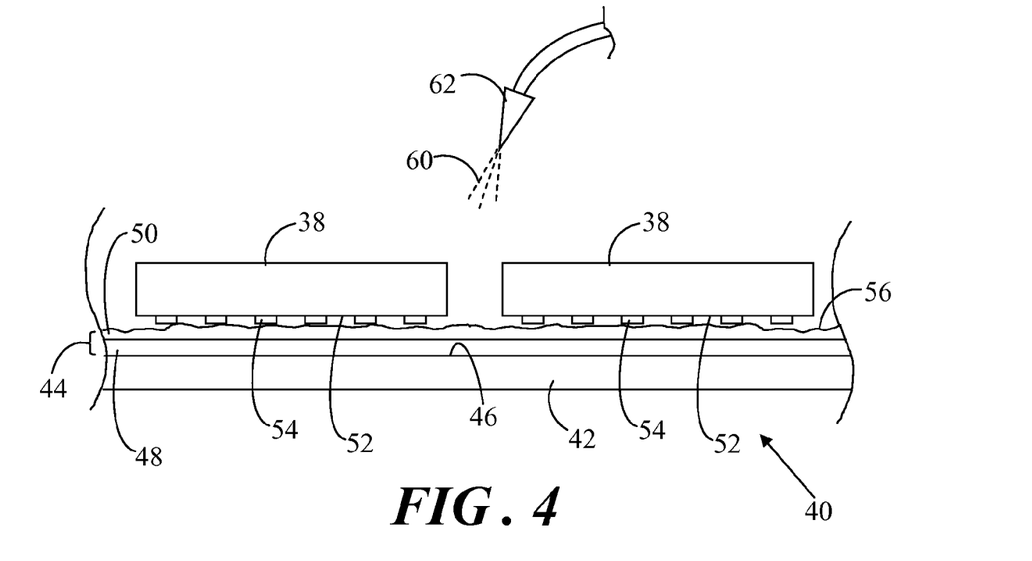
FIG. 4 shows a side view of the portion of IC dies shown in FIG. 3 further along in processing.

With reference back to FIG. 2, following task 36, a task 58 is performed. At task 58, a swelling agent is sprayed onto a surface of the adhesive coating and allowed to evaporate. Referring to FIG. 4 in connection with task 58, FIG. 4 shows a side view of the portion of IC dies 38 shown in FIG. 3 further along in processing. Structure 40 further includes a swelling agent 60. In one embodiment, swelling agent 60 is uniformly distributed over adhesive coating 50 and IC dies 38 as an atomized spray from a spray nozzle 62 of conventional spray equipment.

Although nozzle 62 appears close to IC dies 38 and adhesive coating 50 in FIG. 4, a distance between nozzle 62 and IC dies 38 can be as close as ten mil up to approximately twenty inches away from IC dies 38. More particularly, nozzle 62 may be between four to ten inches away from IC dies 38. A spray pressure of swelling agent 60 from nozzle 62 may be between one half to eighty pounds per square inch (psi), and more typically between one half and five psi. A relatively low spray pressure is desirable to limit any spray induced change to the topography, i.e., the shape and form, of surface 56 of adhesive coating 50. That is, a high spray pressure may modify the roughness of surface 56 of adhesive coating 50 by, for example, pitting surface 56. A rough surface 56 of adhesive coating 50 can adversely effect the surface of the encapsulating material, discussed below, which in turn may be problematic for subsequent processing of the encapsulated IC dies 38.

A moving route for nozzle 62 can be static, i.e., a single spray from above. Alternatively, the moving route for nozzle 62 can be circular movement or moving line by line, i.e., IC die 38 by IC die 38. It should be noted that nozzle 62 need not move across the top of IC dies 38 because the top of IC dies 38 do not necessarily need to be sprayed. Rather, only adhesive coating 50 need be sprayed. Accordingly, using a programmable spray tool, nozzle 62 may alternatively be placed below the top of IC dies 38 in the gap between IC dies 38.

The spray duration is dependent on the moving route of nozzle 62. For example, a single spray from above takes on the order of as little as a few seconds. However, moving nozzle 62 line by line can take a longer duration, for example, up to fifteen minutes for a three hundred millimeter diameter panel of IC dies 38. As mentioned above, swelling agent 60 is delivered as an atomized spray. As an atomized spray, the droplet size of agent 60 should not exceed a few microns. This atomized spray of swelling agent 60 is desirable to obtain reproducible and consistent swelling of adhesive coating 50.

Figure 5:
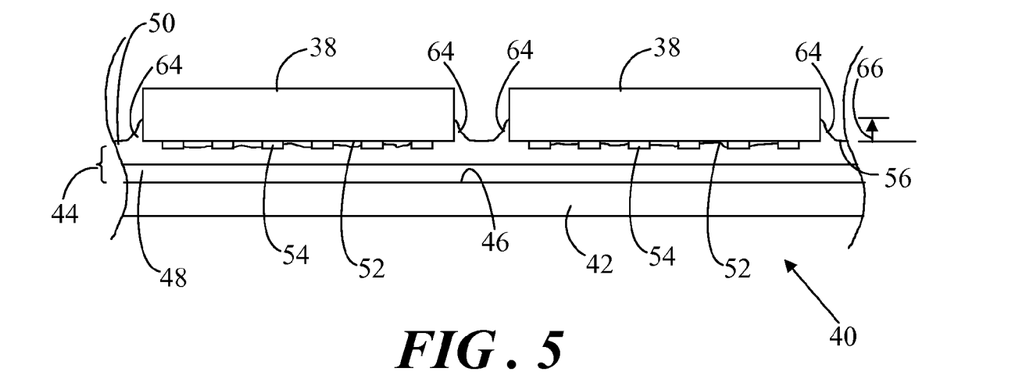
FIG. 5 shows a side view of the portion of IC dies shown in FIG. 4 further along in processing.

Referring now to FIG. 5 in connection with task 58 of IC die packaging process 34 (FIG. 2), FIG. 5 shows a side view of the portion of IC dies 38 shown in FIG. 4 further along in processing. In response to application of swelling agent 60 (FIG. 4), adhesive coating 50 is allowed to swell into contact with bond pads 54 and around active surface 52 near the edges of IC dies 38. Swelling agent 60 can swell into contact with bond pads 54 to fill the gaps which may be present between bond pads 54 and adhesive surface 56. In addition, or alternatively, a fillet 64 of swelled adhesive coating 50 may be formed about a perimeter of each of IC dies 38. Any remaining swelling agent 60 then evaporates off adhesive surface 56 and IC dies 38.

In one embodiment, swelling agent 60 is a solvent, i.e., a liquid that is typically capable of dissolving a solid, liquid, or gaseous solute. However, appropriate selection of the solvent swelling agent 60 and the appropriate application of agent 60 causes silicone polymer adhesive coating 50 to swell in the presence of solvent swelling agent, rather than its being dissolved by swelling agent 60. The appropriate selection of solvent swelling agent 60 entails choosing a solvent having the appropriate solubility parameters, solvent polarity, boiling point, and so forth. It is desirable that solvent swelling agent 60 causes the proper amount of swelling of adhesive coating 50 and causes little change (with the exception of the desired swelling) to the topography of adhesive surface 56. Moreover, the appropriate swelling agent 60 should have little or no chemical reaction with silicone polymer adhesive coating 50 and liner 48 of release film 44.

When considering solvent solubility, a suitable solvent to serve as swelling agent 60 is one that does not dissolve adhesive coating 50, but also does not cause excessive swelling of adhesive coating 50. A height 66 of fillet 64 of swelled adhesive coating 50 is desirably between one half and one hundred microns, and more particularly between two and ten microns. Height 66 is directly affected by the propensity for swelling agent 60 to swell adhesive coating 50. Thus, excessive swelling of adhesive coating 50 can result in fillets 64 having height 66 that is greater than one hundred microns. Excessively high fillets 64 can increase the chance of getting voids during subsequent dielectric buildup processes, discussed below. In addition, excessive swelling of adhesive coating 50 can change the uniformity of adhesive surface 56, which can alter the topography of the encapsulated IC die 38, again causing problems during subsequent dielectric buildup processes.

A solubility parameter is a numerical value that indicates the relative solvency behavior of a particular solvent. Liquids and solids are held together by intermolecular force. For a solution to occur, the solvent molecules must overcome the intermolecular force in the solute and find their way between and around the solute molecules. At the same time, the solvent molecules themselves must be separated from each other by the molecules of the solute. This intermolecular force is known as van der Waals forces. One of the most widely applicable solubility scales is known as the Hildebrand solubility parameter which reflects the total van der Waals force of a solvent. Through experimentation, toluene, having a Hildebrand solubility parameter of 18.3 (SI units), causes the appropriate degree of swelling of silicone polymer adhesive coating 50 without significantly changing its topography (with the exception of the desired swelling). However, hexane, having a Hildebrand solubility parameter of 14.9 (SI units) causes too much swelling of adhesive coating. Acetone, with a Hildebrand solubility parameter of 19.7 (SI units), does not provide the appropriate adhesive swell, but rather dissolves silicone polymer adhesive coating 50.

Swelling agent 60 is also selected in terms of its polarity. Solvents can be broadly classified into polar and non-polar solvents. The polarity of a solvent determines what type of compounds it is able to dissolve and with what other solvents or liquid compounds it is miscible. As a rule of thumb, polar solvents dissolve polar compounds best and non-polar solvents dissolve non-polar compounds best. This rule of thumb is sometimes referred to as "like dissolves like." A polar solvent can attack the bonding of silicone polymer adhesive coating 50 and the underlying polyimide liner 48. This attack can cause the detachment of adhesive coating 50 from liner 48. A polar solvent can also cause significant change to the topography of adhesive surface 56, which can cause problems during subsequent dielectric buildup processes. Accordingly, in one embodiment, swelling agent 60 is a non-polar solvent, such as toluene, so as to prevent or limit chemical reaction between swelling agent 60 and silicone polymer adhesive coating 50.

Another important property of solvents is boiling point. The boiling point of a solvent determines the speed of evaporation. A rapid evaporation of swelling agent 60 is desirable so that residue solvent does not remain on adhesive coating 50. This residue solvent can cause problems when the encapsulating, or molding material, is applied as discussed below. In addition, due to the small molecular weight and size of solvent swelling agent 60, the longer agent 60 sits on adhesive coating 50, the larger the penetration depth of agent 60 into coating 50. This can cause height 66 of fillets 64 to be in excessive. Accordingly, the boiling point of solvent swelling agent 60 should be in a range of fifty to one hundred fifty degrees Celsius if solvent spray and evaporation processes are performed at room temperature in order to ensure fast evaporation. By way of example, the boiling point of toluene is 110.6° C. It should be understood that under the conditions of sub-ambient or super-ambient processing temperatures, a different solvent swelling agent 60 having a lower or higher boiling point then that of toluene may be selected in order to achieve the appropriate evaporation rate.

Toluene is discussed above as being a suitable solvent swelling agent 60 when used in combination with release film 44 formed of polyimide liner 48 and silicone polymer adhesive coating 50. Toluene is a suitable solvent because it exhibits the appropriate solubility, it is a non-polar solvent, and its boiling point appropriate for causing relatively rapid evaporation. However, it should be understood that although the solvent toluene is described herein, those skilled in the art will recognize that other solvents may be employed that cause the appropriate degree of swelling of adhesive coating 50 without dissolving it or otherwise changing the topography of coating 50.

Figure 6:
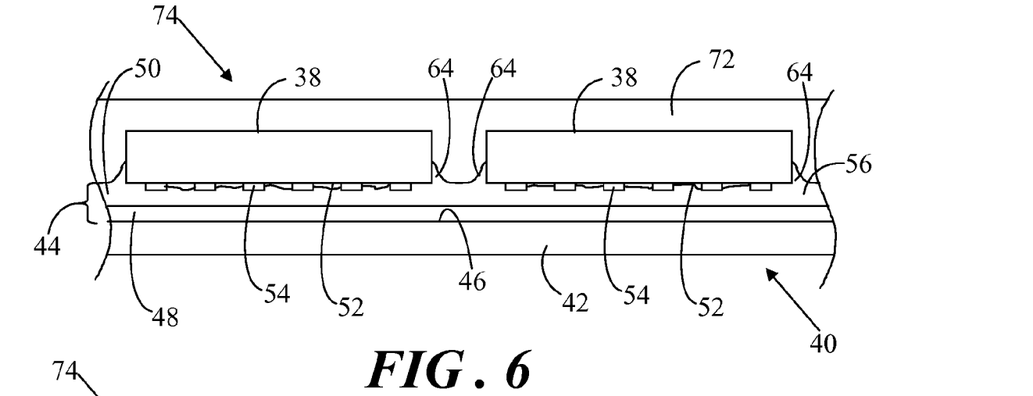
FIG. 6 shows a side view of the portion of IC dies shown in FIG. 5 further along in processing.

Now referring back to IC die packaging process 34 (FIG. 2), following application of swelling agent 60 (FIG. 4) and its subsequent evaporation at task 58, process 34 continues with a task 70. At task 70, IC dies 38 are encapsulated with a molding material to form a panel of IC dies 38. Referring to FIG. 6 in connection with task 66, FIG. 6 shows a side view of the portion of IC dies 38 shown in FIG. 5 further along in processing. As further shown, IC dies 38 are encapsulated in a molding material 72. One exemplary molding material 72 is a silica-filled epoxy molding compound, although other known and upcoming molding materials 72 may be utilized. It should be noted that the presence of fillets 64 of adhesive coating 50 as well as the swelling of adhesive coating 50 into contact with bond pads 54 prevents the bleeding of molding material 72 against bond pads 54. Once IC dies 38 are encapsulated, a panel 74 containing multiple IC dies 38 is formed.

With reference back to FIG. 2, following task 70, a task 76 is performed. At task 76, panel 74 is cured. By way of example, a cure profile may entail exposure of panel 74 to a temperature of one hundred degrees Celsius for a duration of sixty minutes immediately followed by exposure of panel 74 to a temperature of one hundred fifty degrees for another duration of sixty minutes. Those skilled in the art will recognize that other cure profiles suitable for particular molding materials may alternatively be utilized.

Next, a task 78 is performed. At task 78, panel 74 may be backgrinded to an appropriate thickness in accordance with conventional processes. In an alternative embodiment, panel 74 may be molded to the appropriate thickness as known to those skilled in the art.

Figure 7:
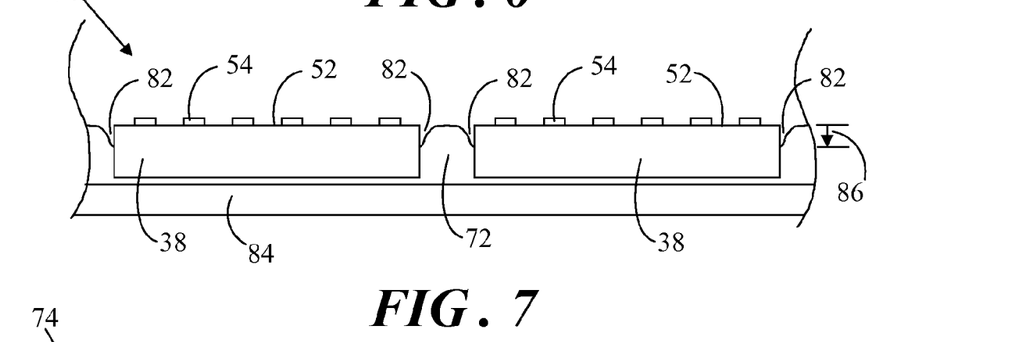
FIG. 7 shows a side view of the portion of IC dies shown in FIG. 6 further along in processing.

Following task 78, at a task 80, panel 74 is released from support substrate 42 (FIG. 3) and adhesive coating 50 (FIG. 3) may be cleaned away from bond pads 54 per conventional processes. Referring to FIG. 7 in connection with task 80, FIG. 7 shows a side view of the portion of IC dies 38 shown in FIG. 6 further along in processing. Following removal of support substrate 42 and adhesive coating 50, voids 82 remain about a perimeter of each of IC dies 38 where fillets 64 of adhesive coating 50 were once located. Panel 74 of IC dies 38 may subsequently be attached to a carrier 84 for further processing, as known to those skilled in the art.

It bears repeating that fillets 64 are controlled to height 66 (FIG. 5) that is between approximately one half to one hundred microns. Consequently, a corresponding height 86 of voids 82 will be approximately the same as height 66 of fillets 64. If fillets 64 are excessively high, resulting in excessively deep voids 82, problems can be encountered during subsequent dielectric deposition processes. For example, during a spin coating process, excessively deep voids 82 may cause a step or other surface non-conformities of the dielectric. In addition, excessively deep voids 82 can result in an inadequate amount of molding material 72 surrounding IC dies 38 to hold them in place.

Figure 8:
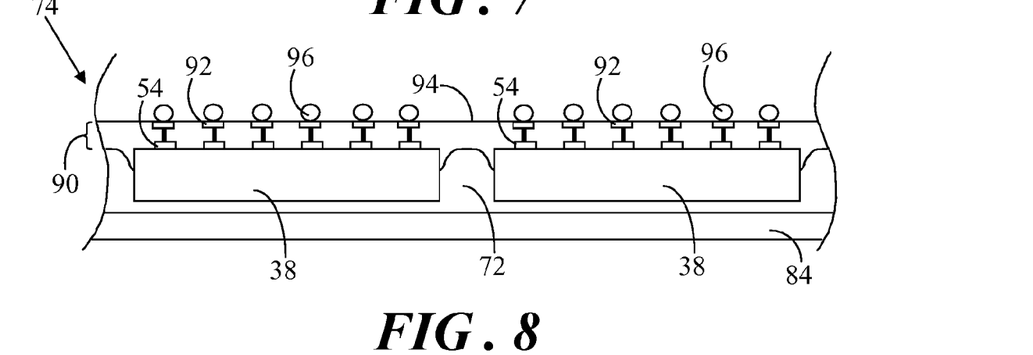
FIG. 8 shows a side view of the portion of IC dies shown in FIG. 7 further along in processing.

Referring back to FIG. 2, following task 80, a task 88 is performed. At task 88, panel 74 of IC dies 38 undergoes processing to route out signals, power, and ground lines between bond pads 54 on active surface 52 of each of IC dies 38. Referring to FIGS. 2 and 8, FIG. 8 shows a side view of the portion of IC dies 38 shown in FIG. 7 further along in processing. Routing may be performed using standard silicon manufacturing equipment. These processing steps can include the deposition of copper metallization layers by electroplating techniques. The metal layers are generally separated by insulating layers typically formed from a spin-coated photoimageable dielectric, and patterned using batch process lithography. The combination of metal layers and insulating layers are collectively represented by a representative layer 90 in FIG. 8. The number of metal layers in a package is dictated by the package size, land grid array or ball grid array pitch requirement, input/output count, power and ground requirements, and routing design rules. The metal layers connect bond pads 54 on active surface 52 to pads 92 placed on an exterior surface 94 of panel 74. Pads 92 can then be provided with a nickel-gold (NiAu) alloy or solder finish for land grid array (LGA) or solder balls 96 for ball grid array (BGA).

Referring back to IC die packaging process 34 of FIG. 2, following task 88, a task 98 is performed. At task 98, panel 74 is separated into individual IC die packages. Following task 98, IC die packaging process 34 exits.

Figure 9:
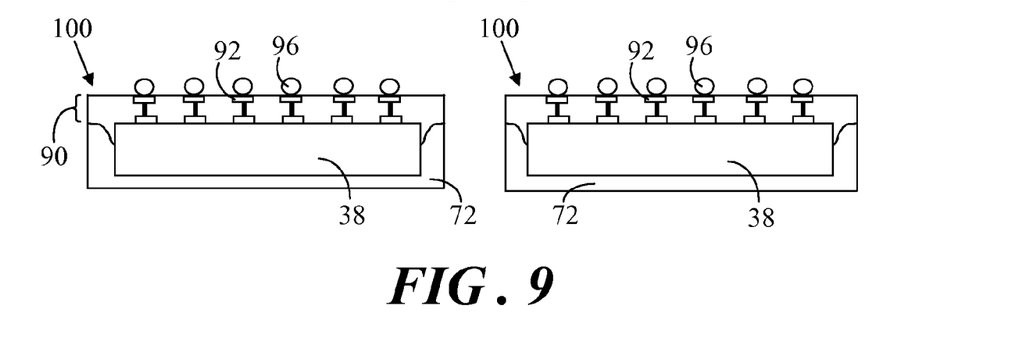
FIG. 9 shows a side view of IC dies packages resulting from execution of the IC die packaging process of FIG. 2.

FIG. 9 shows a side view of IC die packages 100 resulting from execution of IC die packaging process 100 of FIG. 2. At this point IC die packages 100 can be processed in accordance with known processes in preparation for their incorporation into electronic devices.

An embodiment described herein comprises a method of packaging an integrated circuit (IC) die. Packaging entails a chips-first methodology in which the package is built around the bare IC dies. Prior to IC die encapsulation the IC dies are placed active side down on an adhesive coating that secures the IC dies onto a support substrate. The adhesive coating is then sprayed with a swelling agent in the form of a non-polar solvent. The swelling agent causes the adhesive coating to swell into contact with bond pads located on the active surface and/or to form fillets of adhesive coating around the IC does so that the molding material used during IC die encapsulation does not bleed onto the bond pads. Thus, the process of swelling the adhesive coating with an appropriately selected solvent effectively protects the bond pads of and IC die from resin, i.e., molding material, bleed when undergoing encapsulation. The simple and cost-effective application of a swelling agent to protect the bond pads is achieved utilizing conventional equipment during panelization of IC chips. Thus, the methodology can be readily implemented within existing packaging methodologies.

What is claimed is:

1. A method of packaging an integrated circuit (IC) die having bond pads located on an active surface of said IC die, said method comprising:
   attaching a release film over a support substrate, said release film having an adhesive coating situated on a side of said film opposite said support substrate;
   placing said IC die on said support substrate with said active surface in contact with said release film;
   applying a swelling agent over said adhesive coating;
   allowing said adhesive coating to swell into contact with said bond pads in response to application of said swelling agent;
   encapsulating said IC die in a molding material; and
   releasing said IC die from said support substrate.

2. A method as claimed in claim 1 further comprising selecting a solvent as said swelling agent.

3. A method as claimed in claim 2 wherein said selecting operation comprises selecting a non-polar solvent as said solvent.

4. A method as claimed in claim 2 further comprising selecting said solvent from a group of solvents that exhibits a boiling temperature in a range of fifty to one hundred and fifty degrees Celsius.

5. A method as claimed in claim 1 further comprising selecting toluene as said swelling agent.

6. A method as claimed in claim 1 further comprising selecting said release film having said adhesive coating formed from a silicone polymer.

7. A method as claimed in claim 1 wherein said applying operation comprises distributing said swelling agent uniformly over said adhesive coating.

8. A method as claimed in claim 1 wherein said applying operation comprises distributing said swelling agent as an atomized spray over said adhesive coating.

9. A method as claimed in claim 1 wherein said applying operation comprises spraying said swelling agent over said adhesive coating at a pressure in a range of 0.5-5 psi.

10. A method as claimed in claim 1 wherein said allowing operation comprises forming a fillet of said adhesive coating about a perimeter of said IC die, said fillet exhibiting a height in a range of approximately one half to one hundred microns.

11. A method as claimed in claim 1 further comprising preventing a flow of said molding material onto said bond pads of said IC die when said adhesive coating swells around at least an active surface of said IC die.

12. A method as claimed in claim 1 wherein said IC die is one of multiple IC dies, each of said multiple IC dies having said active surface, and said method further comprises:
   placing each of said multiple IC dies on said support substrate with said active surface facing said release film;
   applying said swelling agent over said adhesive coating of said release film;
   allowing said adhesive coating to swell into contact with said bond pads on said active surface of said each of said multiple IC dies in response to application of said swelling agent;
   concurrently encapsulating said multiple IC dies in said molding material following said applying operation;
   releasing said multiple IC dies from said support substrate as a panel following said encapsulating operation; and
   separating said multiple IC dies of said panel to form individual IC packages.

13. A structure for temporarily holding at least one integrated circuit (IC) die during packaging thereof, said IC die having bond pads located on an active surface of said IC die, said structure comprising:
   a support substrate;
   a release film overlying a surface of said support substrate, said release film including a polyimide liner coated with a silicone polymer adhesive coating, wherein said adhesive coating temporarily holds said active surface of said at least one IC die in a desired placement on said support substrate and is swollen by an amount that encapsulates at least said active surface of said IC die in response to application of a solvent adapted to cause swelling of said adhesive coating, said solvent having been uniformly distributed as an atomized spray over said adhesive coating to cause said adhesive coating to swell into contact with said bond pads and encapsulate at least said active surface of said IC die.

14. A structure as claimed in claim 13 wherein said solvent exhibits a boiling temperature in a range of fifty to one hundred and fifty degrees Celsius.

15. A structure as claimed in claim 13 wherein said solvent is a non-polar solvent.

16. A structure as claimed in claim 13 wherein said solvent comprises toluene.

17. A method of packaging an integrated circuit (IC) die having bond pads located on an active surface of said IC die, said method comprising:
   attaching a release film over a support substrate, said release film having an adhesive coating situated on a side of said film opposite said support substrate;
   placing said IC die on said support substrate with said active surface in contact with said release film;
   applying a swelling agent over said adhesive coating by uniformly distributing said swelling agent over said adhesive coating as an atomized spray;
   allowing said adhesive coating to swell into contact with said bond pads in response to application of said swelling agent;
   encapsulating said IC die in a molding material, wherein when said adhesive coating swells around said IC die, said molding material is prevented from flowing onto said bond pads of said IC die; and
   releasing said IC die from said support substrate following encapsulation of said IC die.

18. A method as claimed in claim 17 further comprising:
utilizing said release film having said adhesive coating formed from a silicone polymer; and
selecting a non-polar solvent as said swelling agent.

19. A method as claimed in claim 17 further comprising selecting said solvent from a group of solvents that exhibits a boiling temperature in a range of fifty to one hundred and fifty degrees Celsius.

20. A method as claimed in claim 17 wherein said allowing operation comprises forming a fillet of said adhesive coating about a perimeter of said IC die, said fillet exhibiting a height in a range of approximately one half to one hundred microns.

* * * * *